United States Patent
Timopheev et al.

(10) Patent No.: US 12,228,620 B2
(45) Date of Patent: Feb. 18, 2025

(54) MAGNETIC SENSOR ELEMENT AND DEVICE HAVING IMPROVED ACCURACY UNDER HIGH MAGNETIC FIELDS

(71) Applicant: Allegro MicroSystems, LLC, Manchester, NH (US)

(72) Inventors: Andrey Timopheev, Vif (FR); Jeffrey Childress, San Jose, CA (US); Nikita Strelkov, Meylan (FR)

(73) Assignee: Allegro MicroSystems, LLC, Manchester, NH (US)

( * ) Notice: Subject to any disclaimer, the term of this patent is extended or adjusted under 35 U.S.C. 154(b) by 167 days.

(21) Appl. No.: 17/998,984

(22) PCT Filed: May 10, 2021

(86) PCT No.: PCT/IB2021/053951
§ 371 (c)(1),
(2) Date: Nov. 16, 2022

(87) PCT Pub. No.: WO2021/234504
PCT Pub. Date: Nov. 25, 2021

(65) Prior Publication Data
US 2023/0213597 A1    Jul. 6, 2023

(30) Foreign Application Priority Data

May 20, 2020   (EP) .................................... 20315252

(51) Int. Cl.
*G01R 33/00* (2006.01)
*G01R 33/09* (2006.01)
*G01R 33/12* (2006.01)

(52) U.S. Cl.
CPC ....... *G01R 33/0017* (2013.01); *G01R 33/098* (2013.01); *G01R 33/1215* (2013.01)

(58) Field of Classification Search
CPC .............. G01R 33/0017; G01R 33/098; G01R 33/1215
See application file for complete search history.

(56) References Cited

U.S. PATENT DOCUMENTS

| | | | |
|---|---|---|---|
| 10,620,279 B2 * | 4/2020 | Campiglio | G01R 33/0005 |
| 2011/0068786 A1 * | 3/2011 | Ohta | G01R 33/0052 |
| | | | 324/252 |

(Continued)

FOREIGN PATENT DOCUMENTS

JP    2011027633 A    2/2011

OTHER PUBLICATIONS

International Search Report issued in Application No. PCT/IB2021/053951 dated Jul. 28, 2021.

(Continued)

*Primary Examiner* — Feba Pothen
(74) *Attorney, Agent, or Firm* — DALY, CROWLEY, MOFFORD & DURKEE, LLP

(57) ABSTRACT

Magnetic angular sensor element destined to sense an external magnetic field, including a magnetic tunnel junction containing a ferromagnetic pinned layer having a pinned magnetization, a ferromagnetic sensing layer, and a tunnel magnetoresistance barrier layer; the ferromagnetic sensing layer including a first sensing layer being in direct contact with the barrier layer and having a first sensing magnetization, a second sensing layer having a second sense magnetization, and a metallic spacer between the first sensing layer and the second sensing layer; wherein the metallic spacer is configured to provide an antiferromagnetic coupling between the first sensing magnetization and the second sensing magnetization such that the first sensing magnetization is oriented substantially antiparallel to the second sensing magnetization; the second sensing magnetization being larger than the first sensing magnetization, such that (Continued)

the second sensing magnetization is oriented in accordance with the direction of the external magnetic field.

8 Claims, 7 Drawing Sheets

(56) References Cited

U.S. PATENT DOCUMENTS

| | | |
|---|---|---|
| 2014/0145792 A1 | 5/2014 | Wang et al. |
| 2014/0242418 A1 | 8/2014 | Shukh |
| 2019/0051822 A1 | 2/2019 | Chatterjee et al. |

OTHER PUBLICATIONS

Written Opinion for PCT/IB2021/053951 dated Jul. 28, 2021.
European Search Report issued in Application No. EP20315252 dated Nov. 9, 2020.

* cited by examiner

MAGNETIC SENSOR ELEMENT AND DEVICE HAVING IMPROVED ACCURACY UNDER HIGH MAGNETIC FIELDS

FIELD

The disclosure relates to a magnetic angular sensor element and to a magnetic angular sensor device comprising a plurality of the magnetic angular sensor element for detecting a magnetic field angle over a 360° range of measurement of a plane.

BACKGROUND

Magnetic tunnel junction (MTJ) based magnetic angular sensors provide a high sensitivity, wide range of their output resistance, better integration into CMOS process and many other attractable features compared to the competing technologies existing on the market.

Such magnetic angular sensors require a specific MTJ typically comprising two magnetically different ferromagnetic layers separated by a dielectric tunneling barrier. One of the ferromagnetic layers (sensing layer) is magnetically soft and is easily aligned by an external magnetic field, the other one is magnetically rigid (reference layer) with a pinned direction of its magnetization.

Tunnel magnetoresistance (TMR) effect is employed to sense the relative angle between the magnetization of the sensing layer and the magnetization of the reference layer, and thus to measure a direction of an external magnetic field. Change of the relative angle between the sensing layer and the reference layer magnetization can be determined by measuring a change of the electrical conductivity through the MTJ stack. The conductivity of a MTJ stack follows a cosine function of the relative angle between net magnetization direction in the sensing and reference layers. For 2D magnetic field sensing, magnetization of the reference layer usually lies in-plane (in the plane of the reference layer), while magnetic state of the sensing layer can be different. Due to this functional dependence, two MTJ stacks with 90° shifted pinning direction of their reference layers are enough to make a 2D magnetic field angle sensor.

FIG. 1 shows a single-branch sensing circuit 10 comprising a magnetic sensor element 20. The magnetic sensor element 20 can comprise one or several electrically connected MTJ pillars fabricated from an MTJ stack, all having the same pinning direction of reference layer. Each MTJ stack comprises (not shown) a tunnel barrier layer sandwiched between a reference layer, a sensing layer. When an external magnetic field 60 is applied, the sensing layer magnetization 230 is oriented in the direction of the external magnetic field 60. The orientation of the reference layer magnetization 210 remains unchanged. The direction of the external magnetic field 60 can thus be measured by passing a sensing current in the magnetic sensor element 20 and measuring voltage difference ($V_{out}$-$V_{in}$) being proportional to the resistance R of the magnetic sensor element 20.

Ideally, the reference layer magnetization 210 should be insensible to the external magnetic field within the working range of the sensor while the sensing layer magnetization 230 should be perfectly soft and thus should be magnetized exactly along the direction of the external magnetic field 60.

Practically however, the sensing layer magnetization has a finite magnetic anisotropy and the sensing layer magnetization can be subjected to finite stray field from the reference layer. This causes angular errors in the alignment of the sensing layer magnetization in the external magnetic field 60 and thus, in the expected resistance R of the magnetic sensor element for a given angle of magnetic field 60. These angular errors limit operational margin of the sensor at low magnitudes of the external magnetic field, since the angular error increases when lowering the magnitude of the external magnetic field 60.

Moreover, the reference layer has finite magnetic stiffness and therefore its magnetization can be deflected (even only slightly) by the external magnetic field. This also produces angular errors in the alignment of the reference layer magnetization. These angular errors increase with the magnitude of the external magnetic field and therefore limit the high-field operation margin of the magnetic sensor element.

FIG. 2 reports the variation of the total angular error $AE_T$ as a function of the magnitude of an external magnetic field $H_{ext}$. The total angular error $AE_T$ corresponds to a difference between the measured relative angle between the direction of the sensing layer magnetization and reference layer magnetization when an external magnetic field is applied and an "ideal" relative angle, i.e., when the sensing layer magnetization is completely aligned in the direction of the external magnetic field, and when the reference layer magnetization is not deflected by the external magnetic field. The variation of the total angular error $AE_T$ corresponds to the sum of the angular error $AE_S$ in sensing layer orientation due to anisotropy in sensing layer, bias field etc., and angular error $AE_R$ in reference layer magnetization orientation due to finite reference layer pinning strength.

FIG. 3 shows an alternative sensing circuit 30 comprising two magnetic sensor elements 20 arranged in a half-bridge configuration. The half-bridge circuit 30 produces an output voltage $V_{out}$ that is a fraction of its input voltage $V_{in}$. One of the two magnetic sensor elements 20 has a reference layer magnetization 210 that is pinned in a direction opposed the reference layer magnetization 210 of the other magnetic sensor element 20.

As discussed above, the reference layer magnetization 210 in the two magnetic sensor elements 20 can be deflected towards the direction of an applied external magnetic field 60 (shown by the curved arrow in FIG. 3). The deflection causes the reference layer magnetization 210 to be more parallel to the sensing layer magnetization 230 and tends to decrease the resistance in each of the two magnetic sensor elements 20. However, the half-bridge sensing circuit 30 configuration results in a lower relative change in the voltage divider ratio $V_{out}/V_{in}$ than the relative change of resistance in each magnetic sensor elements 20 measured separately. This is achieved due to the opposed direction of the pinned reference layer magnetization 210 in the two magnetic sensor elements 20. The half-bridge sensing circuit 30 of FIG. 3 allows for partial compensation of the angular error $AE_R$ (thus of the total angular error $AE_T$) due to the deflection of the reference layer magnetization 210.

FIG. 4 compares the variation of the total angular error $AE_T$ as a function of the magnitude $H_{ext}$ of an external magnetic field, calculated for the single-branch sensing circuit 10 of FIG. 1 (line with triangles) and for the half-bridge sensing circuit 30 of FIG. 3 (single line). The calculations were made for different magnitudes of anisotropy strength in sensing layer (Hua), and for different pinning field strength (Hud) in the reference layer. The half-bridge sensing circuit 30 shows lower total angular error $AE_T$ compared to the single-branch sensing circuit 10 of FIG. 1.

Our study has shown that compensation of finite reference layer pinning strength is not fully achieved by using a half bridge circuit configuration due to simultaneous action of two factors.

A first factor concerns the in-plane transversal (a direction perpendicular to the pinning field direction of the reference layer) magnetic susceptibility $\chi_R$ of the reference layer that is asymmetrical with respect to the external magnetic field sign for a given magnetic field angle.

FIGS. 5a and 5b represent the external magnetic field $H_{ext}$ having a longitudinal component $H_{long}$ corresponding to a projection along the direction of the pinning field $H_{pin}$ (of the antiferromagnetic layer exchange coupling the reference layer) and a transversal component $H_{trans}$ corresponding to a projection along a direction perpendicular to the one of the pinning field $H_{pin}$. Transversal susceptibility $\chi_R$ can be defined as $H_{trans}/H_{eff}$, where $H_{eff}=H_{pin}+H_{long}$. Considering the case where $H_{pin}$ is always greater in magnitude than $H_{ext}$ magnitude, $H_{eff}$ will be always larger when directions of $H_{pin}$ and $H_{long}$ are parallel and smaller when those are antiparallel. Consequently, the susceptibility $\chi_R$ will be smaller in the first case and larger in the second case.

FIG. 6 reports the deviation in degree of the reference layer magnetization 210 relative to its pinned orientation, as a function of the orientation of the external magnetic field $H_{ext}$ for the half-bridge sensing circuit 30 of FIG. 3. The deviation is shown for the magnetic sensor element 20 of the top branch (curve A) where the pinned reference layer magnetization 210 (pinning field $H_{pin}$) is parallel to the longitudinal component $H_{long}$ (FIG. 5a) and for the magnetic sensor element 20 of the bottom branch (curve B) where the pinned reference layer magnetization 210 (pinning field $H_{pin}$) is antiparallel to the longitudinal component $H_{long}$ (FIG. 5b). The orientation angle of the external magnetic field $H_{ext}$ shown in FIG. 5 is indicated by the dotted line in FIG. 6. It corresponds to a deviation of the reference layer magnetization 210 of about 5° for the magnetic sensor element 20 of the top branch (curve A) and about 7° for the magnetic sensor element 20 of the bottom branch (curve B).

The reference magnetic susceptibility $\chi_R$ (i.e. level of the reference layer angular deviation) decreases when the external magnetic field $H_{ext}$ has a longitudinal component $H_{long}$ which is parallel to the pinning field $H_{pin}$ of the antiferromagnetic layer (see FIG. 5a). This is due to the pinning field $H_{pin}$ and the longitudinal component $H_{long}$ of the external field $H_{ext}$ adding up, making the reference layer magnetization more difficult to deviate towards the transversal component $H_{trans}$ of the external field $H_{ext}$. Conversely, the reference magnetic susceptibility $\chi_R$ increases when the external magnetic field $H_{ext}$ has a longitudinal component $H_{long}$ which is antiparallel to the pinning field $H_{pin}$ of the antiferromagnetic layer (see FIG. 5b). In this configuration, the longitudinal component $H_{long}$ of the external field $H_{ext}$ is subtracted from the pinning field $H_{pin}$, thus reducing the stiffness of the reference layer magnetization.

Therefore, the first factor is related to unequal deviations of reference layers 210 directions in presence of external magnetic field 60. One sensing element 20 of those two shown on FIG. 3, for which the longitudinal component of the external magnetic field 60 is more antiparallel to the pinning direction of its reference layer 210, have stronger deviation than the other one.

A second factor concerns the relative change of resistance in the two magnetic sensor elements 20. In each branch (each magnetic sensor element 20), a change of the resistance per one degree is dependent on the relative angle θ between the sensing layer and the reference layer (see FIG. 3). The higher the angle θ, the higher the relative change per degree. This is because not the resistance but the conductance of a branch is proportional to cosine of the angle θ between the sensing layer and the reference layer. The rate of change in resistance R with the angle θ is given by equation 1:

$$\frac{\partial R}{\partial \theta} = \frac{2R_{ap}(R_{ap}-R_p)R_p \sin[d\theta]}{(R_{ap}+R_p+(R_{ap}-R_p)\cos[d\theta])^2} \quad (1)$$

FIG. 7 reports the variation of the resistance with the angle ∂R/∂θ as a function of the orientation of the reference layer magnetization 210 relative to the sensing layer magnetization 230 for different TMR magnitudes (defined as 100%*(Rap–Rp)/Rp, where Rap is electrical resistance of sensing element 20 when sensing layer 230 is antiparallel to reference layer 210, and Rp is the corresponding resistance for their parallel configuration), in the half-bridge sensing circuit 30 of FIG. 3. Namely the variation of the resistance is reported for a resistance $R_{ap}$ of the sensing elements 20 forming a half bridge circuit 30 of FIG. 3 and having values of 1.1 kΩ, 1.3 kΩ and 2.0 kΩ.

An angle θ decreasing below 90° corresponds to the sensing layer magnetization 230 approaching an orientation parallel to the reference layer magnetization 210. An angle θ increasing above 90° corresponds to the sensing layer magnetization approaching an orientation antiparallel to the reference layer magnetization 210. The effect of the relative change of resistance R in the two branches is more important when the magnetic sensor element 20 has a higher TMR.

FIG. 7 further shows that, for a given orientation of the external magnetic field $H_{ext}$, the magnetic sensor element 20 where the sensing layer magnetization 230 is oriented closer to an antiparallel orientation to the reference layer magnetization 210 will have higher deviation of the reference layer magnetization 210 and, at the same time, higher change of the resistance per one degree of angular deviation. Thus, the higher the TMR and the softer the reference layer, the smaller the compensational effect of half-bridge circuit configuration and the higher the angular errors at high external magnetic fields.

JP2011027633 discloses a magnetic having first and second MR elements, which respectively contain a magnetization fixed layer, an intervention layer, and a magnetization free layer, in order, to represent magnetic variation, being opposite to each other, under signal magnetic field. The magnetization fixed layer of the first and second MR elements has synthetic structure that contains a pinned layer, a coupling layer, and a pinned layer coupled to the pinned layer in an antiferromagnetic manner, in the order starting from the intervention layer. The total magnetic moment of the pinned layer is equal to or larger than the total magnetic moment of the pinned layer; and the total magnetic moment of the pinned layer is larger than that of the pinned layer.

SUMMARY

The present disclosure concerns a magnetic angular sensor element destined to sense an external magnetic field, comprising a magnetic tunnel junction containing a ferromagnetic pinned layer having a pinned magnetization, a ferromagnetic sensing layer, and a tunnel magnetoresistance spacer layer; the ferromagnetic sensing layer comprising a first sensing layer being in direct contact with the spacer layer and having a first sensing magnetization, a second sensing layer having a second sense magnetization, and a metallic spacer between the first sensing layer and the second sensing layer; wherein the metallic spacer is configured to provide an antiferromagnetic coupling between the first sensing magnetization and the second sensing magnetization such that the first sensing magnetization is oriented substantially antiparallel to the second sensing magnetization; the second sensing magnetization being larger than the first sensing magnetization, such that the second sensing magnetization is oriented in accordance with the direction of the external magnetic field, and wherein, the second sensing layer comprises a plurality of second sensing sublayers, each second sensing sublayer having a second sensing submagnetization amounting to said second sensing magnetization; and wherein two adjacent second sensing sublayers are separated from by a non-magnetic layer being configured to provide a magnetic coupling between the two adjacent second sensing sublayers.

The present disclosure further concerns a magnetic angular sensor device comprising a plurality of the magnetic sensor element; wherein the magnetic sensor elements are arranged in a half-bridge or full bridge configuration.

The magnetic angular sensor element disclosed herein in the half-bridge circuit (or a full-bridge circuit) improved compensation of the angular error $AE_T$ compared to known arrangement of the magnetic angular sensor element, not only at low magnitudes of the external magnetic field 60 but also at high magnitudes of the external magnetic field 60

BRIEF DESCRIPTION OF THE DRAWINGS

The invention will be better understood with the aid of the description of an embodiment given by way of example and illustrated by the figures, in which.

DETAILED DESCRIPTION OF POSSIBLE EMBODIMENTS

Figure 8:
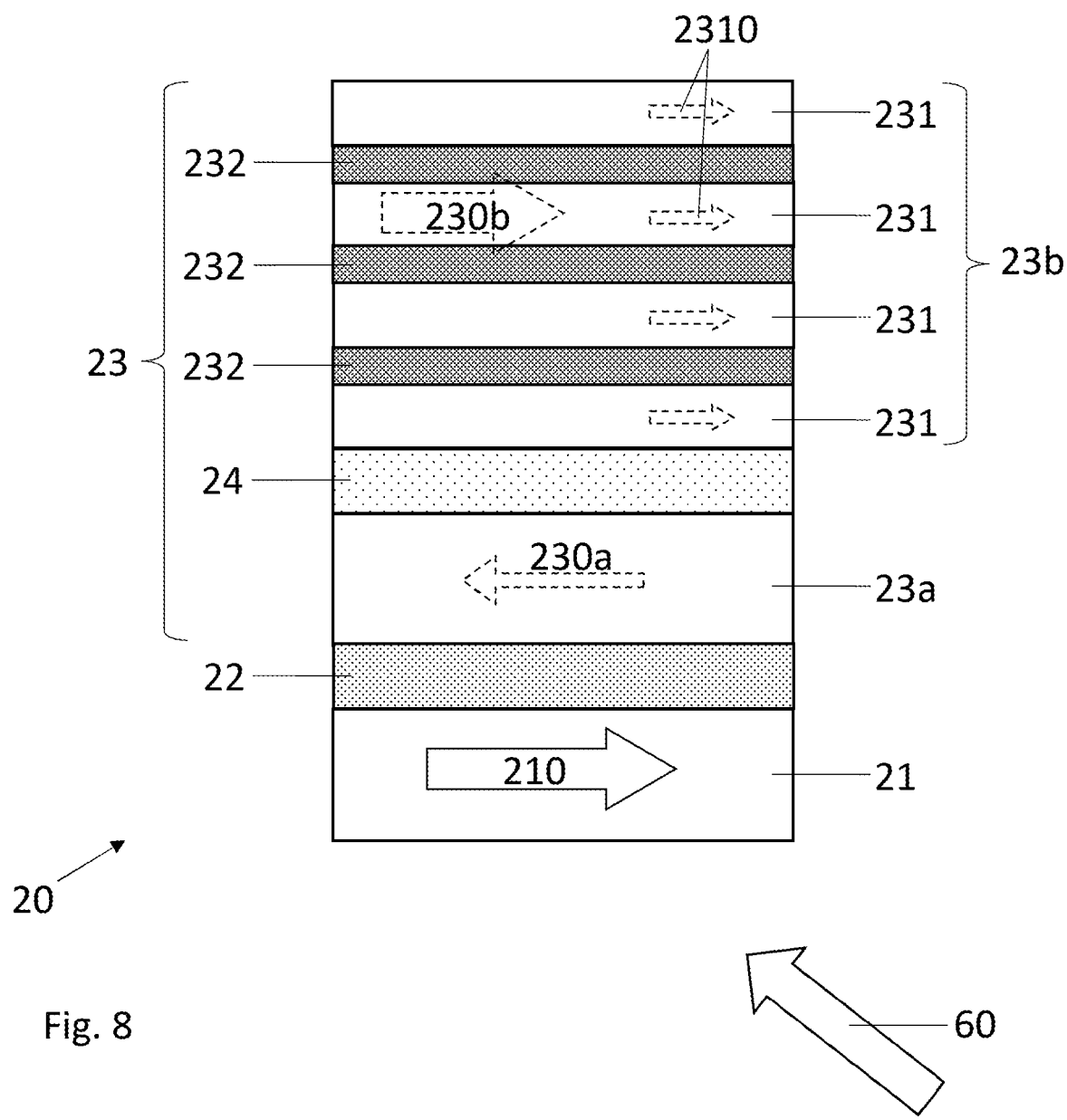
FIG. 8 shows a magnetic angular sensor element, according to an embodiment.

FIG. 8 shows a magnetic angular sensor element 20 destined to sense an external magnetic field ($H_{ext}$) 60, according to an embodiment. The magnetic sensor element 20 comprises a magnetic tunnel junction containing a ferromagnetic pinned layer 21 having a pinned magnetization 210, a ferromagnetic sensing layer 23, and a tunnel magnetoresistance barrier layer 22, between the ferromagnetic pinned layer 21 and the ferromagnetic sensing layer 23. The ferromagnetic sensing layer 23 comprises a first sensing layer 23a being in direct contact with the barrier layer 22 and having a first sensing magnetization 230a, a second sensing layer 23b having a second sense magnetization 230b, and a metallic spacer 24 between the first sensing layer 23a and the second sensing layer 23b.

The metallic spacer 24 is configured to provide an antiferromagnetic coupling between the first sensing magnetization 230a and the second sensing magnetization 230b such that the first sensing magnetization 230a is oriented substantially antiparallel to the second sensing magnetization 230b.

The second sensing magnetization 230b is larger than the first sensing magnetization 230a, such that the second sensing magnetization 230b is oriented in accordance with the direction of the external magnetic field 60.

The present invention further pertains to a magnetic angular sensor device comprising a plurality of the magnetic sensor element 20.

Figure 1:
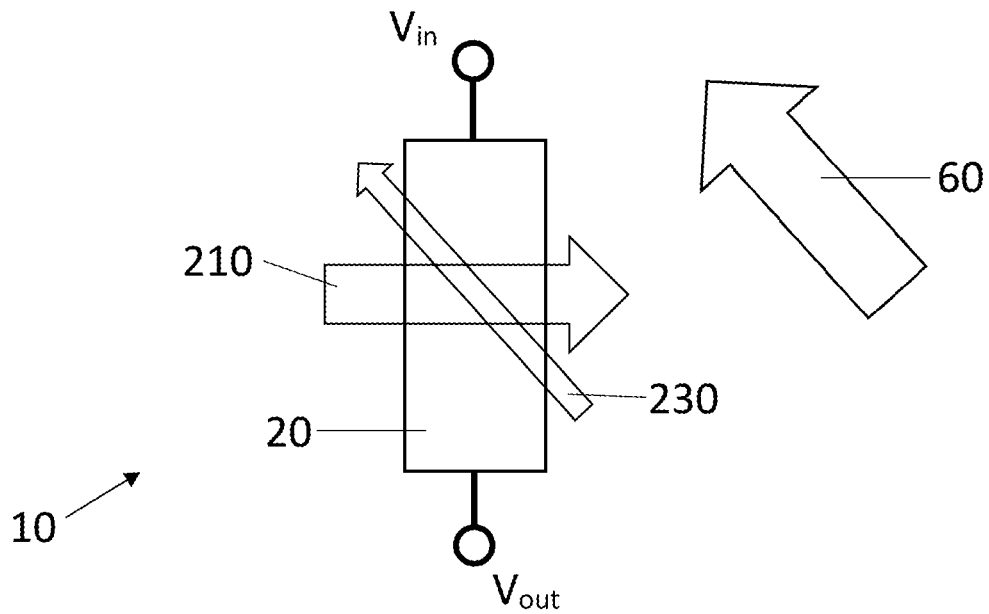
FIG. 1 shows a single-branch sensing circuit comprising a plurality of electrically connected MTJ pillars fabricated from an MTJ film stack. All MTJ pillars share the same pinning direction of their reference layer.
Figure 2:
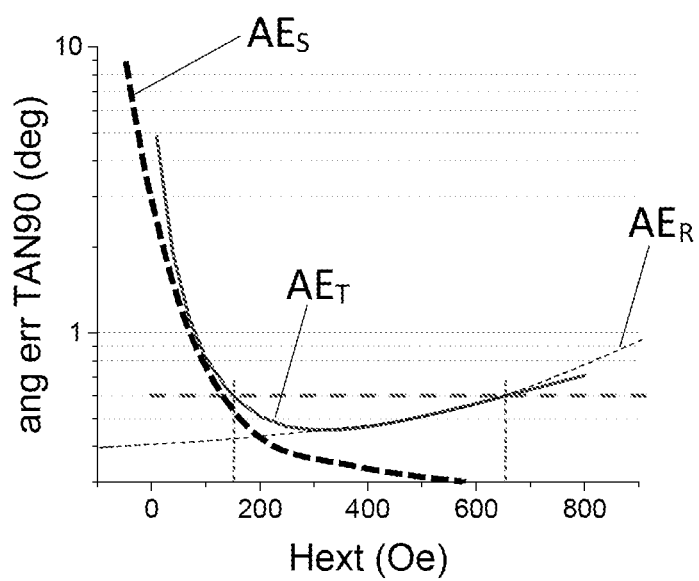
FIG. 2 reports the variation of the total angular error as a function of the magnitude of an external magnetic field.
Figure 3:
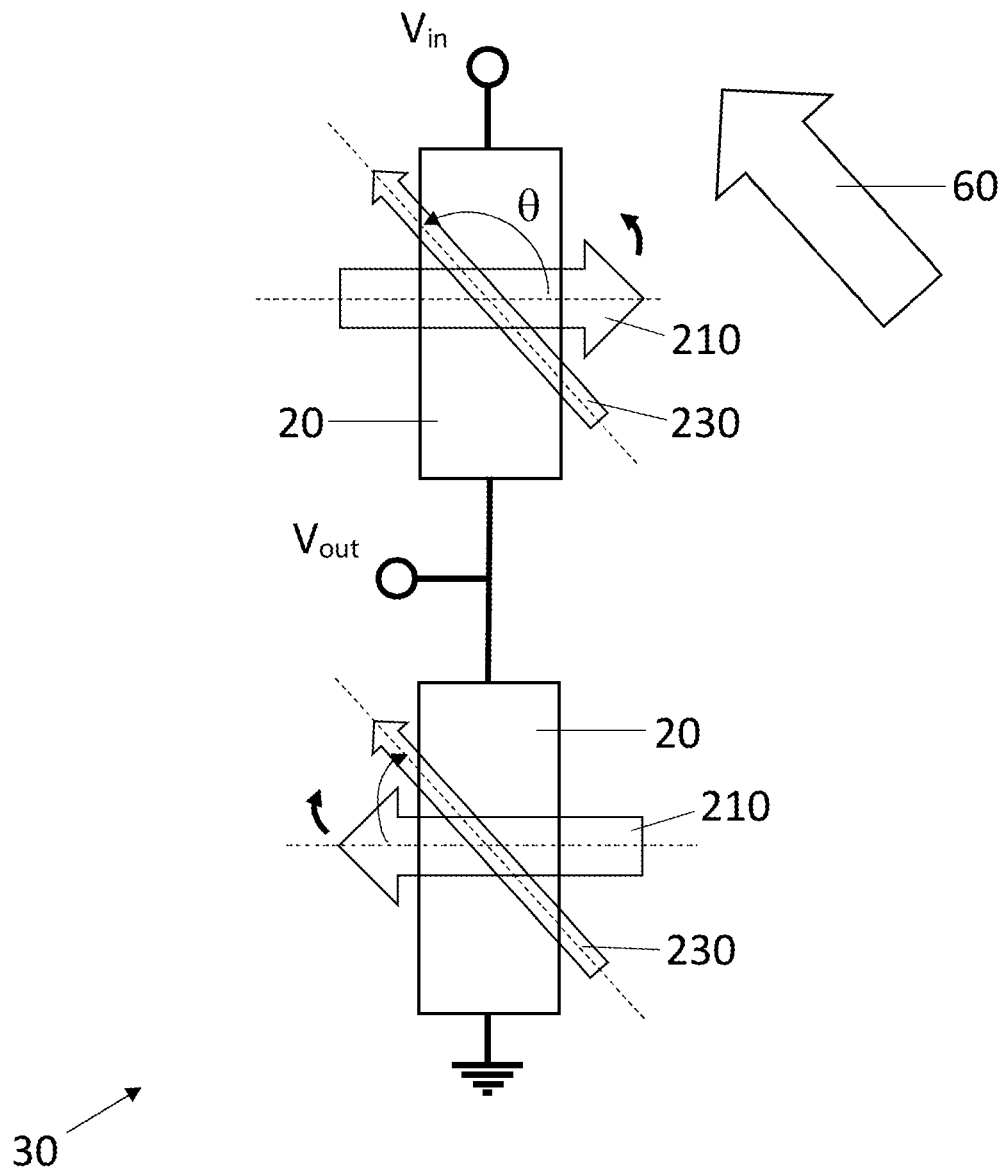
FIG. 3 shows a sensing circuit comprising two MTJ sensing circuits arranged in a half-bridge configuration.
Figure 4:
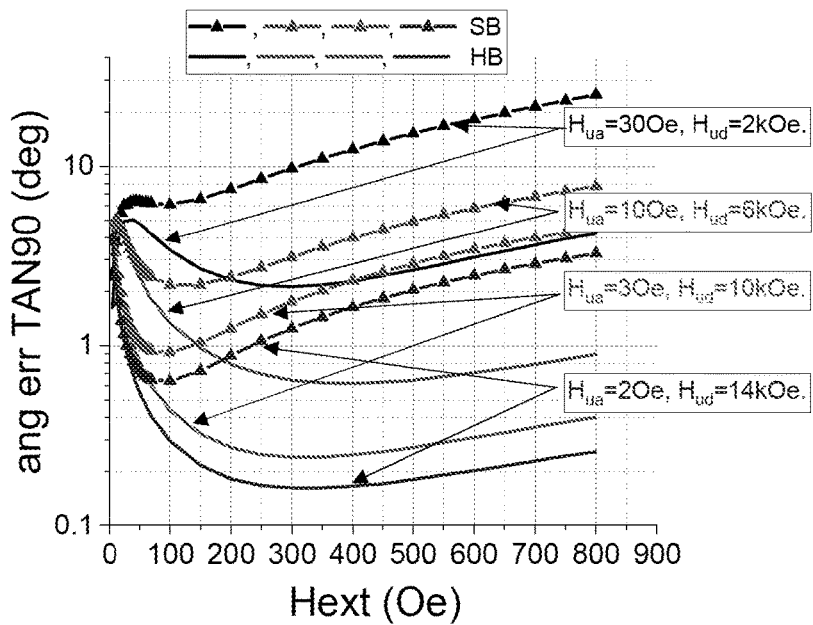
FIG. 4 compares the variation of the total angular error as a function of the magnitude of an external magnetic field, calculated for the single-branch (SB) sensing circuit of FIG. 1 and for the half-bridge (HB) sensing circuit of FIG. 3.
Figure 5:
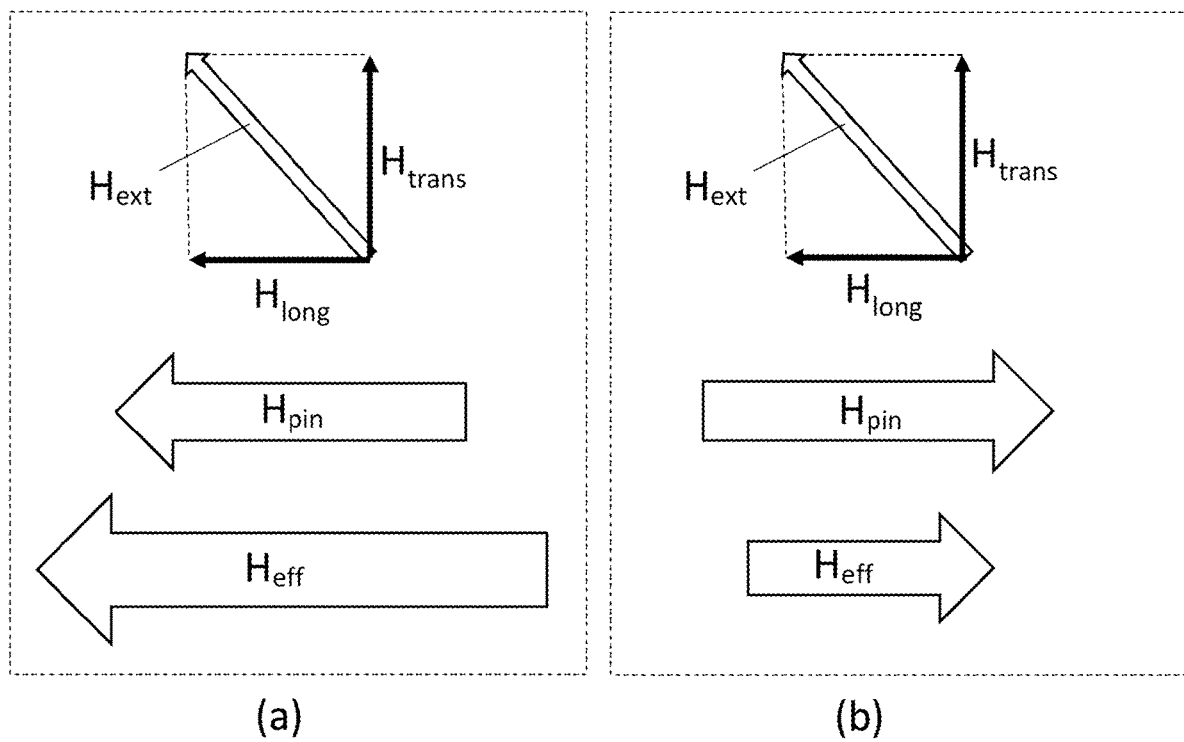
FIGS. 5a and 5b represent a longitudinal component and a transversal component of the external magnetic field.
Figure 6:
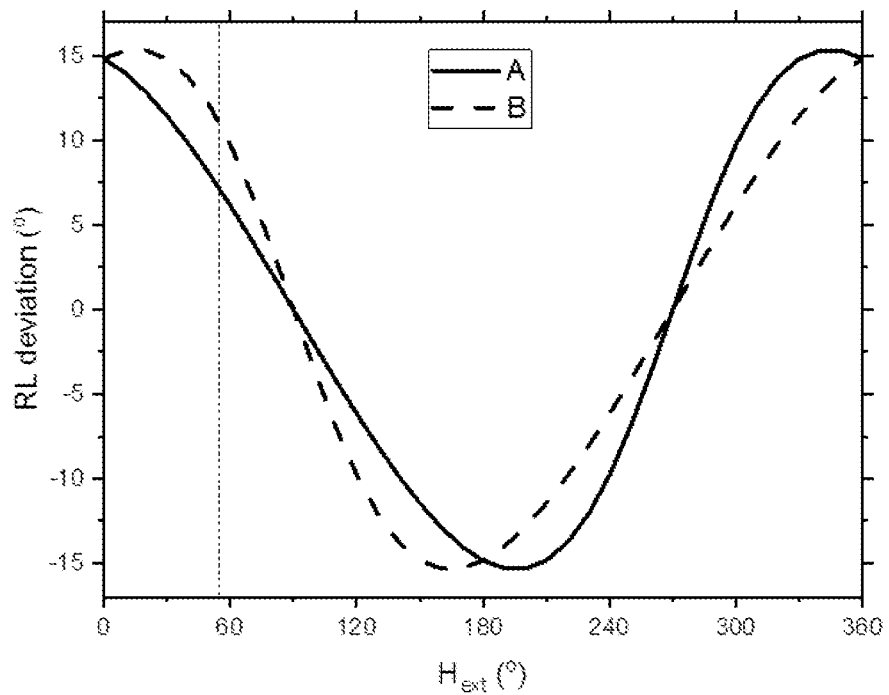
FIG. 6 reports the deviation of the reference layer magnetization relative to its pinned orientation as a function of the orientation of the external magnetic field for the half-bridge sensing circuit of FIG. 3.
Figure 7:
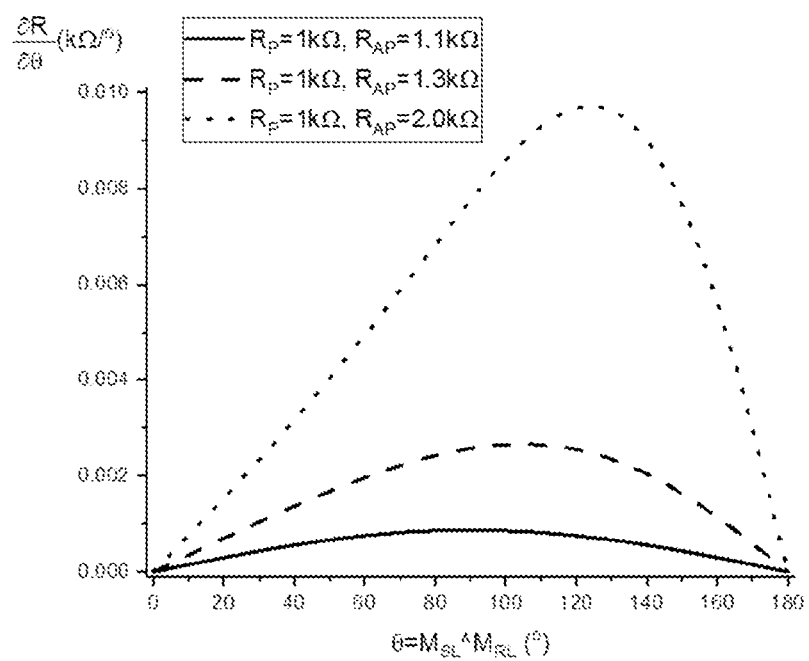
FIG. 7 reports the variation of the derivative of the resistance with the angle as a function of the orientation of the reference layer magnetization relative to the sensing layer magnetization for different TMR.

In a preferred embodiment, the magnetic sensor elements 20 are arranged in a half-bridge circuit 30, as represented in FIG. 3. The magnetic sensor elements 20 can also be arranged in a full bridge configuration.

When the external magnetic field $H_{ext}$ is applied in a direction that is close to an antiparallel orientation with respect to the pinned direction of the reference layer magnetization 210, a higher deviation of the reference layer magnetization 210 occurs (first factor). However, the first sensing layer magnetization 230a is oriented close to a parallel orientation with respect to the pinned direction of the reference layer magnetization 210, reducing the resistance variation per one degree of the reference layer deviation (second factor). The deviation of the reference layer magnetization 210 is thus at least partially compensated by a decrease of the angular variation of the resistance R.

Using the magnetic angular sensor element 20 in the half-bridge circuit 30 (or a full-bridge circuit) improves the compensation of the angular error $AE_T$ compared to known arrangement of the magnetic angular sensor element, not only at low magnitudes of the external magnetic field 60 but also at high magnitudes of the external magnetic field 60.

In an embodiment, the second sensing layer 23b comprises a plurality of second sensing sublayers 231, each second sensing sublayer 231 having a second sensing submagnetization 2310 amounting to said second sensing magnetization 230b. Two adjacent second sensing sublayers 231 are separated from by a non-magnetic layer 232 being configured to provide a magnetic coupling between the two adjacent second sensing sublayers 231.

In another embodiment, the non-magnetic layer 232 is configured to provide a magnetic coupling such that the second sensing magnetization 230b is oriented in a direction opposed to the one of the first sensing magnetization 230a.

In yet another embodiment, the magnetic coupling is such that the second sensing sub-magnetization 2310 of one of the second sensing sublayers 231 is oriented substantially parallel to the one of the adjacent second sensing sublayer 231.

In yet another embodiment, the non-magnetic layer 232 is configured to have a strength (a minimal required strength) of the magnetic coupling such that there is no reversal of the second sensing sub-magnetization 2310 within the second sensing sublayer 231 for an amplitude of the external magnetic field 60 up to 1200 Oe (95493 A/m).

In yet another embodiment, the antiferromagnetic coupling of the metallic spacer 24 is a RKKY coupling having an exchange coupling of 0.3 mJ/m² or greater.

In yet another embodiment, the first sensing magnetization 230a has a thickness of 1.5 nm or greater.

A RKKY coupling having an exchange coupling of 0.3 mJ/m² or greater is enough to stabilize the first sensing layer 23a and second sensing layer 23b in the antiferromagnetic configuration for an external magnetic field $H_{ext}$ that is below 1200 Oe (95493 A/m).

In yet another embodiment, the layers order as shown in FIG. 8 is inverted. Such configuration corresponds to a so-called top-pinned MTJ stack.

For any given TMR magnitude, increasing the pinning strength of the reference layer 21 reduces the asymmetry in the reference magnetic susceptibility $\chi_R$ of the reference layer 21 in the magnetic sensor element 20 in the top branch and bottom branch of the half-bridge circuit 30. Increasing the pinning strength of the reference layer 21 thus diminishes the impact of the effect of the second factor as defined above.

Figure 9:
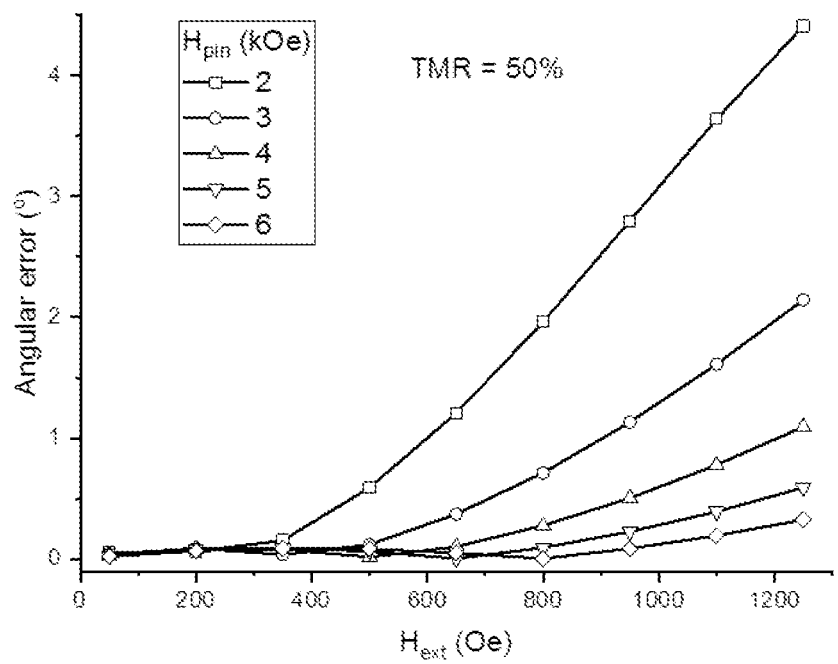
FIG. 9 shows total angular error as a function of the magnitude of the external magnetic field for several values of the pinning field strength.

FIG. 9 shows the angular error in the orientation of the pinned reference layer magnetization 210 as a function of the magnitude of the external magnetic field $H_{ext}$ for several values of the pinning field $H_{pin}$ (pinning strength) and for the magnetic sensor elements 20 having a TMR of 50%.

Figure 10:
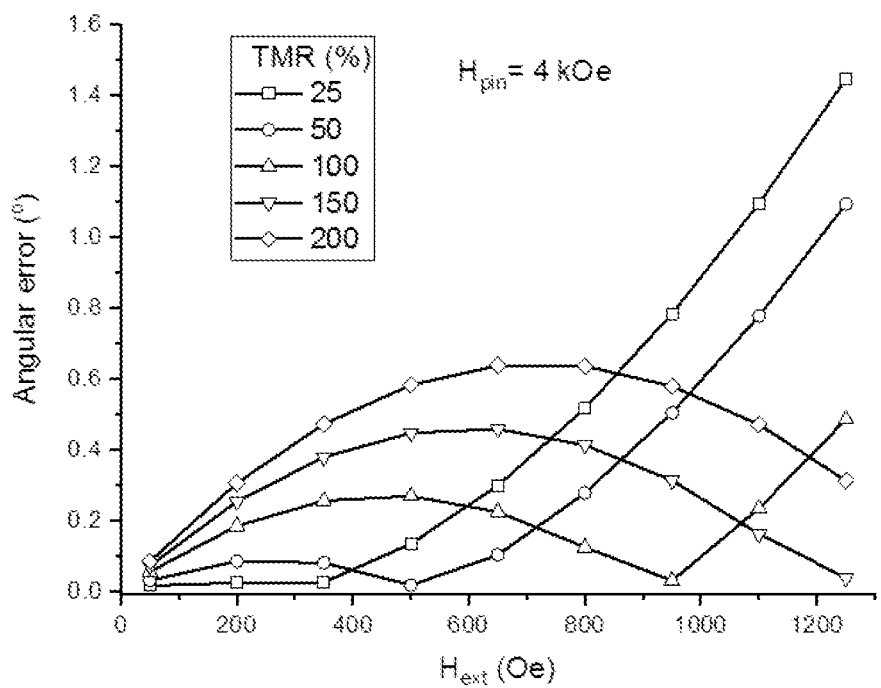
FIG. 10 shows total angular error as a function of the magnitude of the external magnetic field for several values of TMR in MTJ stack.

For any given reference layer pinning field $H_{pin}$, there is an optimal TMR value which provides optimal compensation at a desired magnitude of the external magnetic field $H_{ext}$. FIG. 10 shows total angular error as a function of the magnitude of the external magnetic field $H_{ext}$ for several values of TMR in the magnetic sensor elements 20 and for a pinning field $H_{pin}$ of 4 kOe (318 A/m). The optimum (minimum angular error) can be found numerically and/or optimized by adequate designing of the magnetic sensor element 20.

The strength of the antiferromagnetic coupling (the magnitude of the pinning field $H_{pin}$) should be high enough to keep the reference layer magnetization 210 rigid when submitted to the external magnetic field $H_{ext}$.

Figure 11:
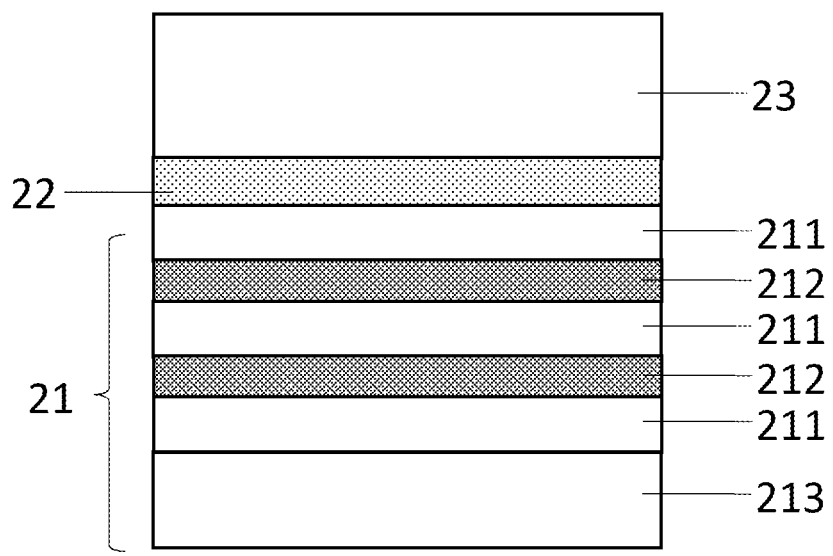
FIG. 11 is a partial view of a magnetic sensor element showing a ferromagnetic pinned layer, a tunnel magnetoresistance barrier layer, and a sensing layer for an example embodiment of the disclosure.

FIG. 11 is a partial view of the magnetic sensor element 20 according to yet another embodiment, showing the ferromagnetic pinned layer 21, the tunnel magnetoresistance barrier layer 22 and the sensing layer 23. The pinned layer 21 comprises a synthetic antiferromagnet (SAF) structure, i.e., a magnetic multilayer comprising comprises ferromagnetic pinned sublayers separated by non-magnetic sublayers. In FIG. 11 the magnetic sensor element 20 is represented comprising three ferromagnetic pinned sublayers 211 separated by two non-magnetic sublayer 212, however the magnetic sensor element 20 can have at least two ferromagnetic pinned sublayers 211 separated by and non-magnetic sublayer 212. The ferromagnetic layer farthest from the tunnel barrier layer 22 is pinned by an antiferromagnet 213 while the other ferromagnetic layers are coupled to the neighbouring ferromagnetic layers by an RKKY coupling mechanism through the non-magnetic layers separating them. Here, the RKKY coupling is essentially antiferromagnetic.

Figure 12:
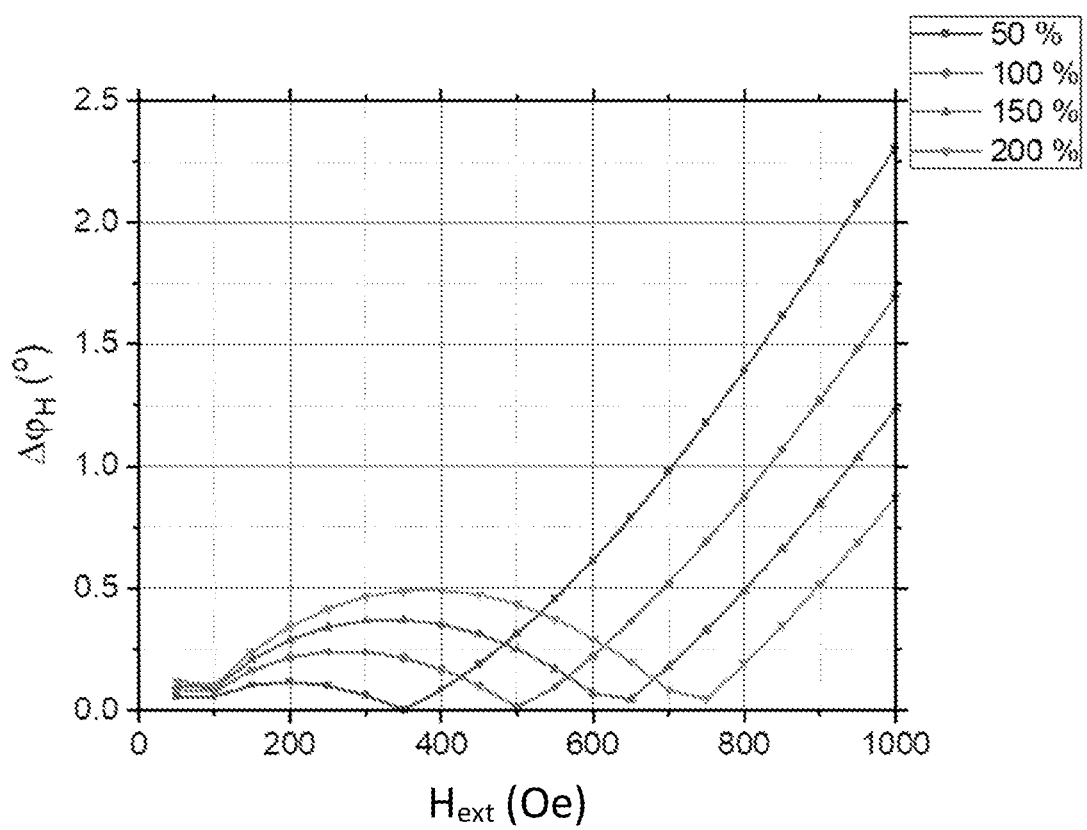
FIG. 12 shows the dependence of angular error $\Delta\varphi H$ on the external magnetic field $H_{ext}$ for different TMR magnitudes for the magnetic sensor element in the configuration of FIG. 11.

FIG. 12 shows the dependence of angular error $\Delta\varphi_H$ on the external magnetic field $H_{ext}$ for different TMR magnitudes for the magnetic sensor element 20 in the configuration of FIG. 11. Here, calculations were performed assuming an exchange pinning of 0.66 mJ/m² and the RKKY coupling of −0.66 mJ/m² for the ferromagnetic layers farthest from the tunnel barrier layer 22 (in the bottom part of the stack). As can be seen from FIG. 12, the SAF configuration of the pinned layer 21 can provide the same improved compensation effect of the angular error as for the configuration shown in FIG. 8. In fact, the improved compensation effect can be obtained for the RKKY exchange coupling being antiferromagnetic and having an absolute magnitude of 0.4 mJ/m² or greater.

REFERENCE NUMBERS AND SYMBOLS 10 magnetic angular sensor device, sensing circuit
20 magnetic angular sensor element, MTJ
21 ferromagnetic pinned layer
210 reference layer magnetization, pinned magnetization
211 ferromagnetic pinned sublayer
212 non-magnetic sublayer
213 antiferromagnet
22 barrier layer
23 ferromagnetic sensing layer
23a first sensing layer
230 sensing layer magnetization
230a first sensing magnetization
23b second sensing layer
230b second sensing magnetization
24 metallic spacer
231 second sensing sublayer
2310 second sensing sub-magnetization
232 non-magnetic layer
30 sensing circuit
60 external magnetic field
$AE_T$ total angular error
$AE_R$ angular error in reference layer orientation
$AE_S$ angular error in sensing layer orientation
$H_{ext}$ magnitude of an external magnetic field
$H_{long}$ longitudinal component
$H_{pin}$ pinning field
$H_{trans}$ transversal component
R resistance
$R_{ap}$ resistance when the sensing and reference layer magnetization are antiparallel
$V_{in}$ input voltage
$V_{out}$ output voltage
θ angle
$\chi_R$ magnetic susceptibility of the reference layer
$\chi_{trans}$ transversal magnetic susceptibility

The invention claimed is:
1. A magnetic angular sensor element destined to sense an external magnetic field, comprising:
 a magnetic tunnel junction containing a ferromagnetic pinned layer having a pinned magnetization;
 a ferromagnetic sensing layer; and a tunnel magnetoresistance barrier layer, between the ferromagnetic pinned layer and the ferromagnetic sensing layer, wherein the ferromagnetic sensing layer comprises a first sensing layer being in direct contact with the barrier layer and having a first sensing magnetization, a second sensing layer having a second sense magnetization, and a metallic spacer between the first sensing layer and the second sensing layer, wherein the metallic spacer is configured to provide an antiferromagnetic coupling between the first sensing magnetization and the second sensing magnetization such that the first sensing magnetization is oriented substantially antiparallel to the second sensing magnetization, wherein the second sensing magnetization being larger than the first sensing magnetization, such that the second sensing magnetization is oriented in accordance with the direction of the external magnetic field, wherein the second sensing layer comprises a plurality of second sensing sublayers, each second sensing sublayer having a second sensing sub-magnetization amounting to said second sensing magnetization, and wherein two adjacent second sensing sublayers are separated from by a non-magnetic layer being configured to provide a magnetic coupling between the two adjacent second sensing sublayers.

2. The magnetic sensor element according to claim 1, wherein the non-magnetic layer is configured to provide a magnetic coupling such that the second sensing magnetization is oriented in a direction opposed to the one of the first sensing magnetization.

3. The magnetic sensor element according to claim 1, wherein the magnetic coupling is such that the second sensing sub-magnetization of one of the second sensing sublayers is oriented substantially parallel to the one of the adjacent second sensing sublayer.

4. The magnetic sensor element according to claim 1, wherein the non-magnetic layer is configured to have a strength of the magnetic coupling of 1 mJ/m$^2$ or greater such that there is no reversal of the second sensing sub-magnetization within the second sensing sublayer for an amplitude of the external magnetic field up to 95493 A/m.

5. The magnetic sensor element according to claim 1, wherein the antiferromagnetic coupling of the metallic spacer is a RKKY coupling having an exchange coupling of 0.3 mJ/m$^2$ or greater.

6. The magnetic sensor element according to claim 1, the pinned layer comprises ferromagnetic layers separated by and non-magnetic layers where the ferromagnetic layers farthest from the tunnel barrier layer are pinned by an antiferromagnet while the other ferromagnetic layers are coupled to the neighbouring ferromagnetic layers by an RKKY coupling mechanism through the non-magnetic layers separating them, wherein the RKKY exchange coupling is antiferromagnetic and has an absolute magnitude of 0.4 mJ/m$^2$ or greater.

7. The magnetic sensor element according to claim 5, wherein the first sensing magnetization has a thickness of 1.5 nm or greater.

8. A magnetic angular sensor device comprising a plurality of the magnetic sensor element according to claim 1, wherein the magnetic sensor elements are arranged in a half-bridge or full bridge configuration.

* * * * *